United States Patent
Lacey et al.

(10) Patent No.: US 6,608,500 B1
(45) Date of Patent: Aug. 19, 2003

(54) I/O ARCHITECTURE/CELL DESIGN FOR PROGRAMMABLE LOGIC DEVICE

(75) Inventors: Timothy M. Lacey, Bedford, NH (US); David L. Johnson, Pleasanton, CA (US)

(73) Assignee: Cypress Semiconductor Corp., San Jose, CA (US)

(*) Notice: Subject to any disclaimer, the term of this patent is extended or adjusted under 35 U.S.C. 154(b) by 0 days.

(21) Appl. No.: 09/539,943

(22) Filed: Mar. 31, 2000

(51) Int. Cl.$^7$ ............................................. H03K 19/177
(52) U.S. Cl. ............................. 326/39; 326/40; 326/41; 326/86
(58) Field of Search ...................... 326/38–41

(56) References Cited

U.S. PATENT DOCUMENTS

| | | | |
|---|---|---|---|
| 4,878,200 A | 10/1989 | Asghar et al. ......... 365/189.02 |
| 5,136,188 A | 8/1992 | Ha et al. .................... 307/465 |
| 5,144,582 A | 9/1992 | Steele .................. 365/189.08 |
| 5,280,202 A | 1/1994 | Chan et al. ................. 307/465 |
| 5,384,745 A | 1/1995 | Konishi et al. ......... 305/230.03 |
| 5,422,823 A | 6/1995 | Agrawal et al. ............. 364/489 |
| 5,451,887 A | 9/1995 | El-Avat et al. ............... 326/39 |
| 5,455,525 A | 10/1995 | Ho et al. ...................... 326/41 |
| 5,521,529 A | 5/1996 | Agrawal et al. .............. 326/41 |
| 5,537,057 A | 7/1996 | Leong et al. ................. 326/41 |
| 5,587,945 A | 12/1996 | Lin et al. .................. 365/185.1 |
| 5,646,901 A | 7/1997 | Sharpe-Geisler et al. ... 365/218 |
| 5,689,195 A | 11/1997 | Cliff et al. .................... 326/41 |
| 5,781,030 A | 7/1998 | Agrawal et al. .............. 326/39 |
| 5,799,176 A | 8/1998 | Kapusta et al. ............. 395/556 |
| 5,811,987 A | 9/1998 | Ashmore, Jr. et al. ........ 326/39 |
| 5,818,254 A | 10/1998 | Agrawal et al. .............. 326/39 |
| 5,848,285 A | 12/1998 | Kapusta et al. ........ 395/800.01 |
| 5,933,023 A | 8/1999 | Young ......................... 326/40 |
| 5,966,027 A | 10/1999 | Kapusta et al. .............. 326/39 |
| 5,977,791 A | 11/1999 | Veenstra ...................... 326/40 |
| 6,034,540 A | * 3/2000 | Mendel ........................ 326/39 |
| 6,049,223 A | 4/2000 | Lytle et al. ................... 326/40 |
| 6,049,225 A | 4/2000 | Huang et al. ................. 326/41 |
| 6,057,707 A | * 5/2000 | Schleicher et al. ........... 326/40 |
| 6,058,452 A | 5/2000 | Rangasayee et al. ........ 711/108 |
| 6,094,064 A | * 7/2000 | Mejia et al. .................. 326/39 |
| 6,130,552 A | 10/2000 | Jefferson et al. ............. 326/39 |
| 6,134,181 A | 10/2000 | Landry ....................... 365/233 |
| 6,137,308 A | 10/2000 | Nayak ......................... 326/39 |
| 6,181,163 B1 | 1/2001 | Agrawal et al. .............. 326/41 |
| 6,191,998 B1 | 2/2001 | Reddy et al. .......... 365/230.05 |
| 6,201,407 B1 | 3/2001 | Kapusta et al. .............. 326/39 |
| 6,271,679 B1 | * 8/2001 | McClintock et al. ......... 326/38 |

OTHER PUBLICATIONS

"Hybrid Product Term and Lut Based Architectures Using Embedded Memory Blocks", By Frank Heile and Andrew Leaver, pp. 13–16. No date.

"An Innovative, Segmented High Performance FPGA Family With Variable–Grain–Architecture and Wide–Gating Functions", By Om Agrawal et al., pp. 17–26. No date.

"A New High Density and Very Low Cost Reprogrammable FPGA Architecture", By Sinan Kaptanoglu et al., pp. 3–12. No date.

"XC4000E and XC4000X Series Field Programmable Gate Arrays", XILINX, May 14, 1996 (Version 1.6), pp. 6–5 to 6–72.

(List continued on next page.)

*Primary Examiner*—Michael Tokar
*Assistant Examiner*—Vibol Tan
(74) *Attorney, Agent, or Firm*—Christopher P. Maiorana, P.C.

(57) ABSTRACT

An apparatus comprising an input/output circuit and a programmable logic device. The input/output circuit may be configured to (i) connect to an end of a bus and (ii) operate in one or more modes in response to one or more control signals. The programmable logic device may be configured to generate said one or more control signals.

20 Claims, 4 Drawing Sheets

OTHER PUBLICATIONS

"XC4000XLA/XV Field Programmable Gate Arrays", XILINX, Oct. 18, 1999, pp. 6–157 to 6–170.

"VIRTEX™ 2.5V Field Programmable Gate Arrays", XILINX, Apr. 2, 2001, pp. 1–20.

"Coolrunner© XPLA3 CPLD", XILINX, Apr. 11, 2001, pp. 1–10.

"Spartan and Spartan–XL Familes Field Programmable Gate Arrays", XILINX, Mar. 2, 2000, pp. 4–1 to 4–66.

"XC9500XV Family High–Performance CPLD", XILINX, Jan. 15, 2001, pp. 1–18.

"Integrated Product–Term Logic in Apex 20K Devices", Altera, Apr. 1999, ver. 1.0, pp. 1–12.

"Apex II Programmable Logic Device Family", Altera, May 2001, ver. 1.1, pp. 1–96.

"Flex 8000 Programmable Logic Device Family", Altera, Jun. 1999, ver. 10.01, pp. 349–410.

"Max 7000 Programmable Logic Device Family", Altera, Mar. 2001, ver. 6.1, pp. 1–62.

"Max 9000 Programmable Logic Device Family", Altera, Jul. 1999, ver. 6.01, pp. 1–40.

"Flex 10K Embedded Programmable Logic Device Family", Altera, Mar. 2001, ver. 4.1, pp. 1–128.

"Mach 5 CPLD Family—Fifth Generation Mach Architecture", Lattice Semiconductor Corp., Rev. 1, Sep. 2000, p. 1–47.

* cited by examiner

I/O ARCHITECTURE/CELL DESIGN FOR PROGRAMMABLE LOGIC DEVICE

CROSS-REFERENCE TO RELATED APPLICATIONS

The present invention may relate to applications U.S. Ser. No. 09/475,879, filed Dec. 30, 1999 and U.S. Ser. No. 09/540,106, filed Mar. 31, 2000 (now U.S. Pat. No. 6,384,628), which are each hereby incorporated by reference in their entirety.

FIELD OF THE INVENTION

The present invention relates to programmable logic devices generally and, more particularly, to an I/O architecture/cell design for a programmable logic device.

BACKGROUND OF THE INVENTION

Traditionally there are two types of programmable logic architectures: complex programmable logic devices (CPLDs) and field programmable gate arrays (FPGAs). The CPLD can be constructed as a one-dimensional array of logic blocks made of 16 macrocells and a product term array connected through a single central interconnect scheme. The CPLD achieves high performance by being able to complete a complex logic function in a single pass of the logic array and has predictable timing by having every output or I/O pin connected to every logic block input through the central interconnect structure. The CPLD can be non-volatile by using an EEPROM process.

However, the architecture of the conventional CPLD has disadvantages. A complex process technology limits performance and increases cost. A high standby power limits capacity and applications. The conventional CPLD has no available on-chip RAM. The maximum capacity of the conventional CPLD is limited by interconnect structure performance, power, technology and die cost. The core voltages, I/O voltages, and I/O standards of the conventional CPLD are not flexible. The I/O cells need a synchronous output enable (OE) to support a synchronous circuit architecture with minimal bus latency (e.g., as found in NoBL™ SRAMs manufactured by Cypress Semiconductor Corp. or ZBT™ devices manufactured by Integrated Device Technology) memory.

An FPGA architecture is constructed from a two dimensional array of logic blocks called CLBs. The CLBs are made from 4-input look-up-tables (LUTs) and flip-flops. The LUTs can be used as distributed memory blocks. The CLBs are connected by a segmented interconnect structure. The FPGA architecture supports a low standby power and the LUTs can use a simple logic CMOS process. Since the two-dimensional array of CLBs and the segmented interconnect structure are scalable, the FPGA can achieve high densities.

However, the architecture of the FPGA has disadvantages. A volatile process requires a FLASH/EEPROM to be added to the design. The segmented routing architecture limits performance and makes timing unpredictable. Implementing a dual port or FIFO memory with LUTs is slow and inefficient. A complex "design-in-process" is required because the conventional FPGAs do not have predictable timing, short compile times, in-system-reprogrammability (e.g., ISR®, a registered Trademark of Cypress Semiconductor Corp.) or pin fixing. The core voltage of the conventional FPGA is (i) not flexible and (ii) driven by the current process. The conventional FPGA makes product migration very difficult and does not support full JTAG boundary scan and configuration.

SUMMARY OF THE INVENTION

The present invention concerns an apparatus comprising an input/output circuit and a programmable logic device. The input/output circuit may be configured to (i) connect to an end of a bus and (ii) operate in one or more modes in response to one or more control signals. The programmable logic device may be configured to generate said one or more control signals.

The objects, features and advantages of the present invention include providing a I/O architecture/cell design for a programmable logic device that may (i) have a simple timing model; (i) provide a STAPL interface to allow for a part to be reconfigured in-system; (iii) support a JTAG boundary scan (including INTEST) for easy debugging; (iv) support the basic I/O standards of JEDEC 1.8V, LVCMOS, LVCMOS2, LVTTL, 3.3V PCI, GTL+, HSTL class I through IV, SSTL2 Class I and II, and SSTL3 Class I and II; and/or (v) provide for combining I/O cells into I/O banks.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
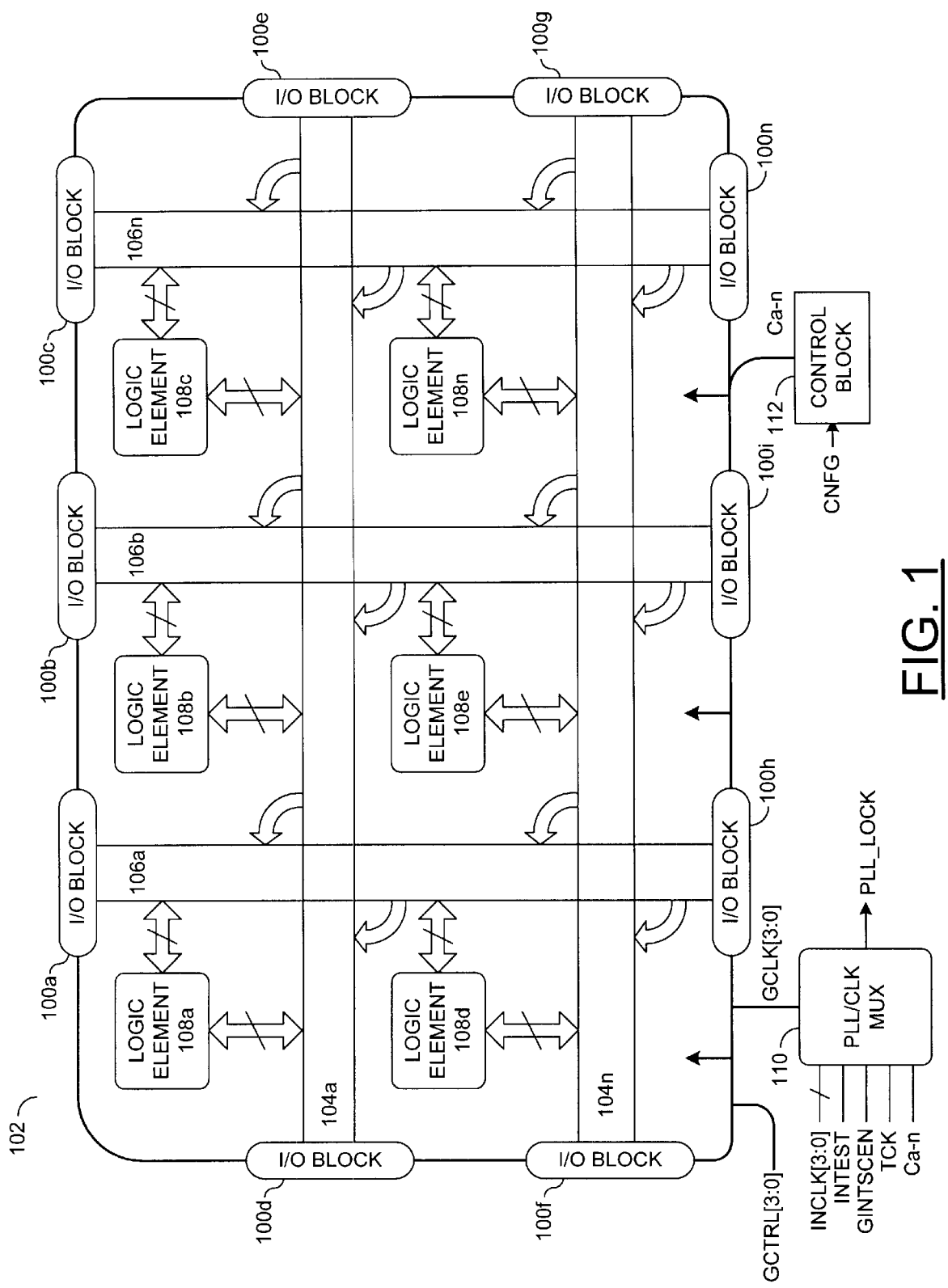
FIG. 1 is a block diagram of a PLD with a number of I/O blocks in accordance with a preferred embodiment of the present invention.

Referring to FIG. 1, a block diagram of an I/O block (or circuit) 100 is shown in accordance with a preferred embodiment of the present invention. A number of input/output (I/O) blocks 100a–100n are shown implemented in the context of a programmable logic device (PLD) 102. The PLD 102 may comprise a number of horizontal routing channels 104a–104n, a number of vertical routing channels 106a–106n, a number of logic elements 108a–108n, a PLL/CLK multiplexer 110, and a control block 112. The I/O blocks 100a–100n may be configured to support multiple I/O standards. One of the I/O blocks 100a–100n may be connected to each end of each routing channel 104a–104n and 106a–106n.

The PLD 102 may have, in one example, four dedicated inputs configured to receive four global I/O control signals (e.g., GCNTRL[3:0]), four dedicated clock inputs configured to receive four input clock signals (e.g., INCLK[3:0]), an input configured to receive a test clock signal (e.g., TCK), an input configured to receive a command signal (e.g., INTEST), and an input configured to receive an enable signal (e.g., GINTSCEN). However, other numbers of dedicated pins and signals may be implemented accordingly to meet the design criteria of a particular application.

The signals GCNTRL[3:0] are generally presented to control inputs of the I/O blocks 100a–100n. The signals GCNTRL[3:0] may be used, in one example, for fast I/O control (e.g., reset, output enable and/or clock enable).

The PLL/CLK multiplexer circuit 110 may be configured to generate a number of clock signals (e.g., GCLK[3:0]). The signals GCLK[3:0] may be generated, in one example, in response to the input clock signals INCLK[3:0]. The signals GCLK[3:0] may comprise, in one example, four clock signals. The signals GCLK[3:0] may be presented to inputs of the I/O blocks 100a–100n.

The control block 112 may be configured to generate a configuration signal (e.g., Ca–n) in response to an input signal (e.g., CONFIG). The signal Ca–n may be N-bits wide, where N is an integer. Each bit of the signal Ca–n may be used as a control signal. The signal Ca–n may be presented to an input of the I/O blocks 100a–100n. The I/O blocks 100a–110n may be configured to operate in one or more modes in response to one or more bits of the signal Ca–n.

The I/O blocks 100a–100n may provide for improved design "fitting", pinout flexibility, and/or I/O performance. The I/O blocks 100a–100n may be combined to form I/O banks. The I/O banks may be configured to support all of the current I/O standards within the 1.5V to 3.3V range.

Figure 2:
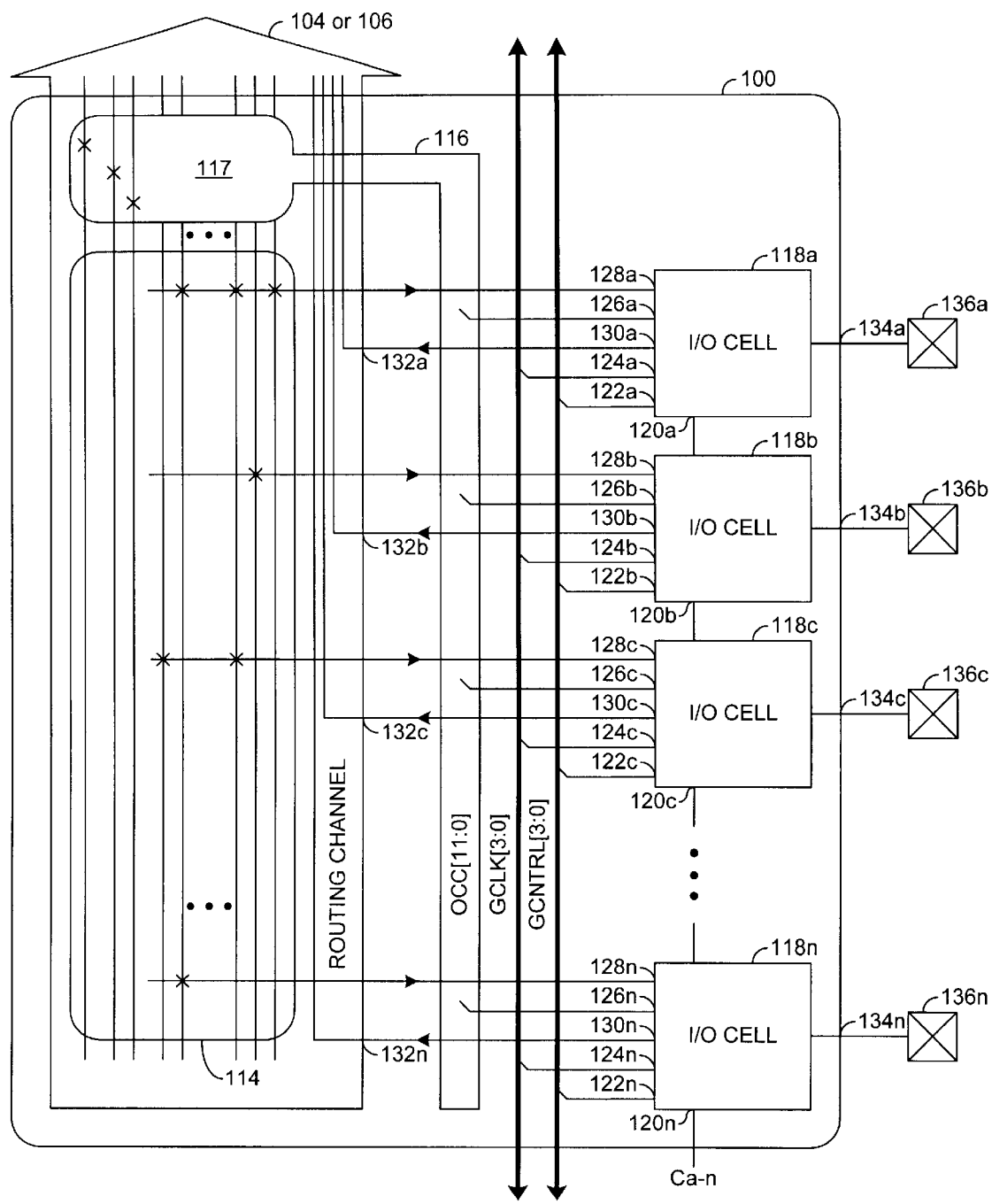
FIG. 2 is a detailed block diagram of a preferred embodiment of an I/O block of FIG. 1.

Referring to FIG. 2, a detailed block diagram of an I/O block 100 illustrating a preferred embodiment is shown. The I/O block 100 generally comprises an output programmable interconnect matrix (PIM) 114, an output control channel (OCC) 116, an output control channel programmable interconnect matrix (OCC PIM) 117, and a number of I/O cells 118a–118n. In one example, the I/O block 100 may comprise 21 I/O cells. The output PIM 114 may connect each of the I/O cells 118a–118n to a track in one of the routing channels 104a–104n and 106a–106n. The I/O cells 118a–118n may have an input 120a–120n that may receive the signal Ca–n, an input 122a–122n that may receive the global I/O control signals GCNTRL[3:0], an input 124a–124n that may receive the global clock signals GCLK [3:0], an input 126a–126n that may receive a number of control signals (e.g. OCC[11:0]) from the output control channel 116, an input 128a–128n that may receive a signal from the output PIM 114, an output 130a–130n that may present a signal to an input 132a–132n of the routing channels 104 or 106, and an input/output 134a–134n that may be connected to a bonding pad 136a–136n.

A number of I/O cells 118a–118n that are bonded to the pins 136a–136n may be determined by a number of I/Os to be offered in a particular package configuration. The OCC 116 may be implemented, in one example, as a bus of six signals that are generally multiplexed from an associated routing channel via the OCC PIM 117. The six signals may be used as control signals in each of the I/O cells 118a–118n. The OCC PIM 117 may allow all lines in the associated routing channel to be sources for the signals of the OCC 116.

The signals GCNTRL[3:0] may be used as output enables, register enables, and/or register resets by the I/O cells 118a–118n. The signals GCNTRL[3:0] are generally driven directly from input pins and allow for faster register clocking and control as well as faster output enable and disable paths. The output enable, register enable, and register reset can alternatively be driven from the OCC 116. The OCC PIM 117 may allow control of the output enables, register enables, and register resets from any signal in the associated routing channel.

Figure 3:
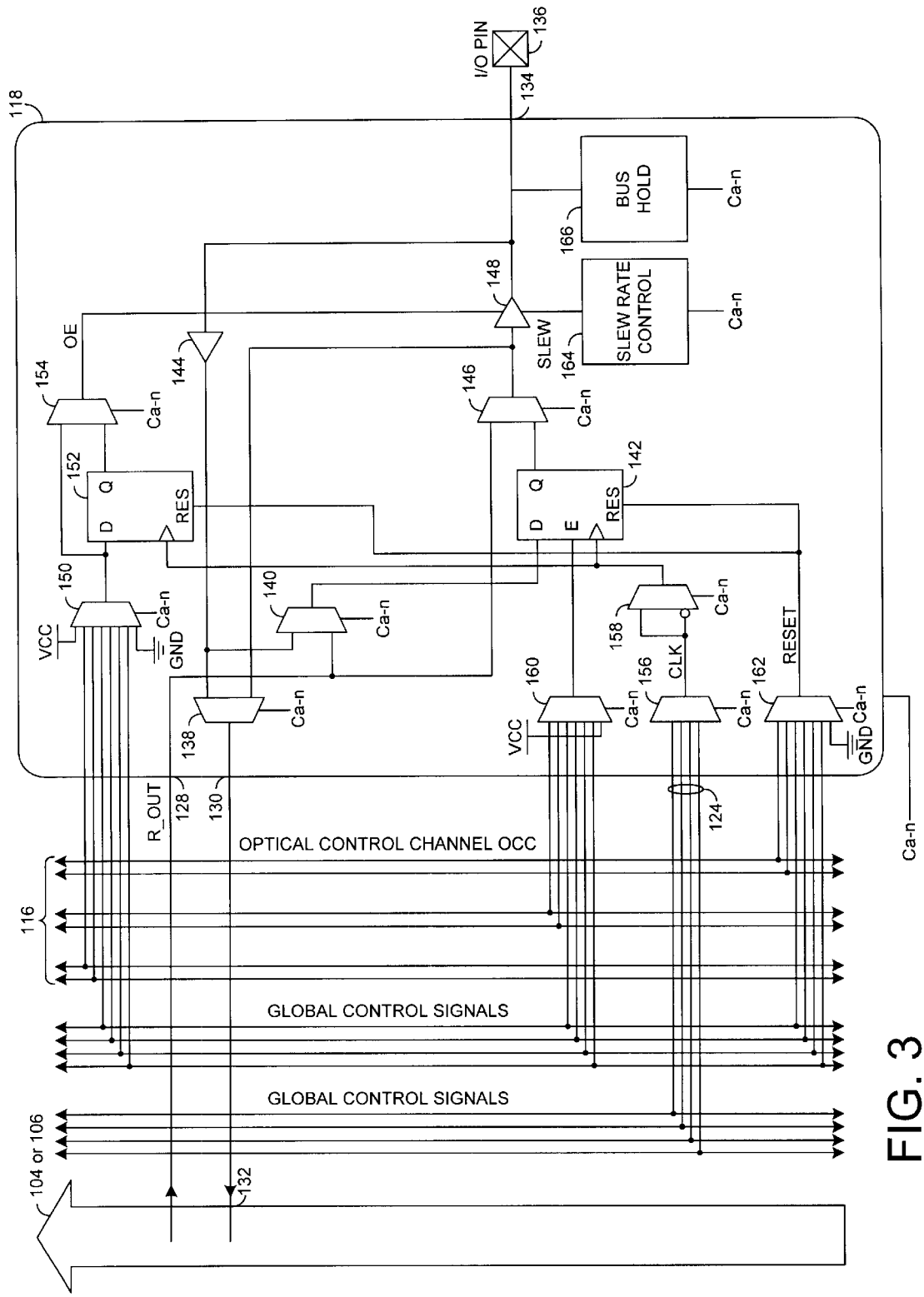
FIG. 3 is a circuit diagram of a preferred embodiment of an I/O cell of FIG. 2.

Referring to FIG. 3, a block diagram of an I/O cell 118 is shown. The I/O cell 118 may comprise a multiplexer 138, a multiplexer 140, a register 142, an input buffer 144, a multiplexer 146, a tristate output buffer 148, a multiplexer 150, a register 152, a multiplexer 154, a multiplexer 156, a multiplexer 158, a multiplexer 160, a multiplexer 162, a programmable slew rate control circuit 164, and a programmable bus hold circuit 166. The registers 142 and 152 may be implemented, in one example, as D-type registers. However, other types of registers may be implemented to meet the design criteria of a particular application.

The I/O cell 118 may be configured to provide a registered input or output and/or a combinatorial input or output. However, only one path (e.g., input or output) may be configured as registered at a time. The multiplexers 138 and 140 may be configured to select the register 142 as either an input register or an output register in response to one or more bits of the signal Ca–n. The multiplexer 138 may select (i) an input signal from the I/O pin 136 via the input buffer 144 or (ii) an output of the register 142 in response to one or more bits of the signal Ca–n for presentation to the input 132 of the routing channel 104 or 106. The multiplexer 140 may select (i) the input signal from the I/O pin 136 via the input buffer 144 or (ii) a signal (e.g., R_OUT) received from the routing channel 104 or 106 as an input signal to the register 142 in response to one or more bits of the signal Ca–n.

An output of the register 142 may be connected to a first input of the multiplexer 146. The signal R_OUT received from the routing channel 104 or 106 at the input 128 may be presented to a second input of the multiplexer 146. The multiplexer 146 may select the signal at the first or second input for presentation at an output in response to one or more bits of the signal Ca–n. The output of the multiplexer 146 may be connected to an input of the tristate output buffer 148. An output of the output buffer 148 may be connected to the I/O pin 136.

The multiplexer 150 may have a number of inputs that may receive the global control signals GCNTRL[3:0], a first number of signals from the OCC 116, a first supply voltage (e.g., VCC), and a second supply voltage (e.g., GND). The multiplexer 150 may have an output that may present a signal to a D-input of the register 152 and a first input of the multiplexer 154. The register 152 may have an output that may present a signal to a second input of the multiplexer 154. The multiplexer 154 may have an output that may present an enable signal (e.g., OE) to an enable input of the tristate output buffer 148. The multiplexers 150 and 154 may select one of the respective input signals as the respective output signals in response to one or more bits of the signal Ca–n.

The register 152 may be implemented as an OE register. The register 152 may provide compatibility for a synchronous circuit architecture with minimal bus latency memory. The output of the I/O cell 118 may be configured, in one example, as always enabled, always disabled, or controlled by the signal OE.

The multiplexer 156 may have a number of inputs that may receive the signals GCLK[3:0] and an output that may present a clock signal (e.g., CLK) to an inverting input and a non-inverting input of the multiplexer 158. The multiplexer 156 may select one of the signals GCLK[3:0] as the signal CLK in response to one or more bits of the signal Ca–n. The multiplexer 158 may select the non-inverted or inverted polarity of the signal CLK for presentation to a clock input of the registers 142 and 152 in response to one or more bits of the signal Ca–n.

The multiplexer 160 may have a number of inputs that may receive the signals GCNTRL[3:0], a second number of signals from the OCC 116, and the supply voltage VCC. The multiplexer 160 may select one of the input signals for presentation to an enable input of the register 142 in response to one or more bits of the signal Ca–n.

The multiplexer 162 may have a number of inputs that may receive the signals GCNTRL[3:0], a third number of signals from the OCC 116, and the supply voltage GND. The multiplexer 162 may select one of the input signals as a reset signal (e.g., RESET) that may be presented to a reset input of the registers 142 and 152 in response to one or more bits of the signal Ca–n.

The slew rate control circuit 164 may have an output that may present a signal (e.g., SLEW) to an input of the tristate output buffer 148. The slew rate control circuit 164 may be configured to generate the signal SLEW in response to one or more bits of the signal Ca–n. The tristate output buffer 148 may be configured to operate at different slew rates in response to the signal SLEW.

The bus hold circuit 166 may be configured to present a signal to the output 134 of the I/O cell 118 in response to one or more bits of the signal Ca–n. The bus hold circuit may weakly hold a state of the I/O pin 136 when the output 134 is tristated.

The I/O cell 118 may be configured for a number of I/O standards that may include, but are not limited to, PCI, SSTL, HSTL, GTL+, LVTTL, LVCMOS, LVCMOS2, LVCMOS18, HSTL (I, II, III, IV), SSTL2 (I, II), SSTL3 (I, II).

Figure 4:
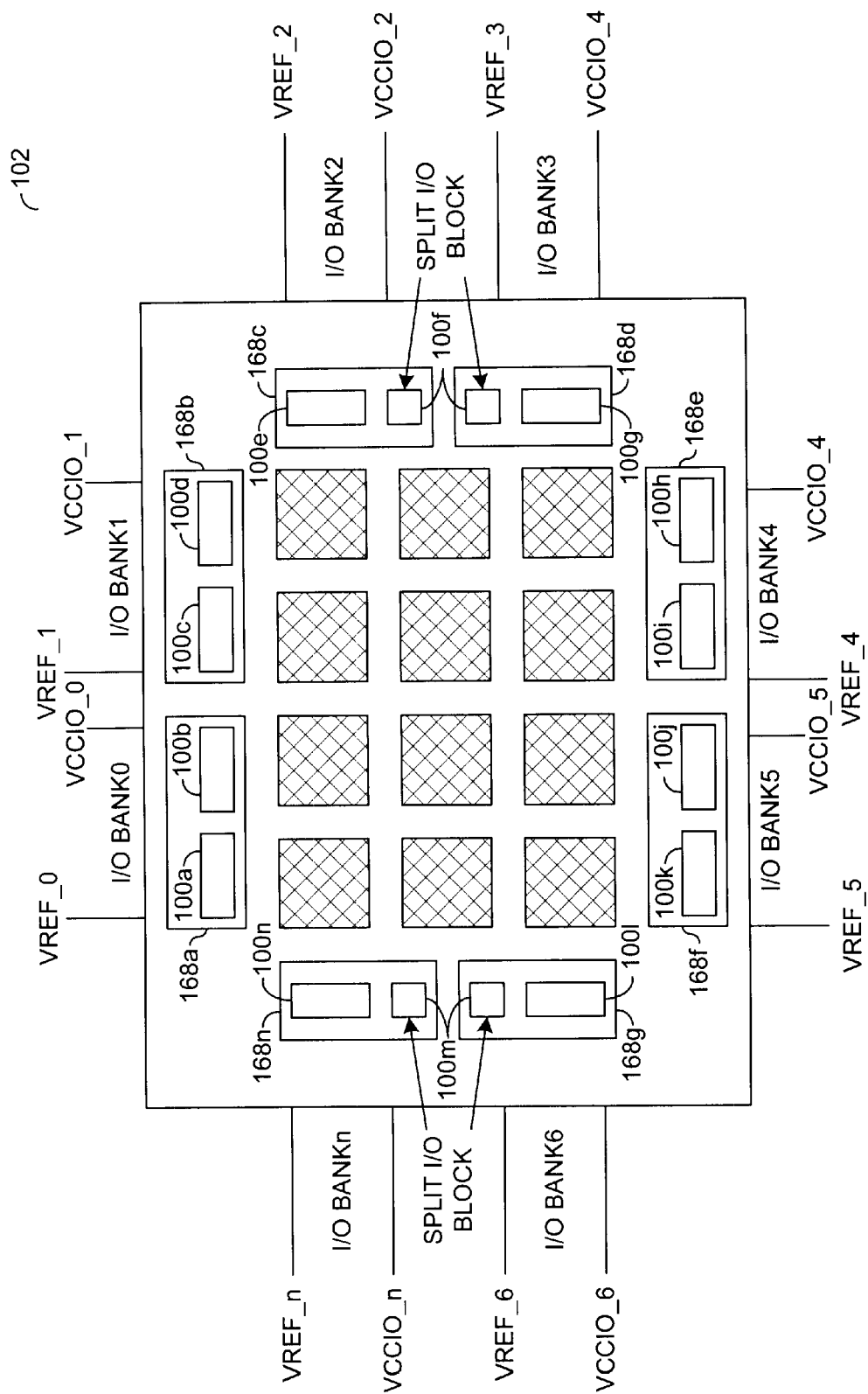
FIG. 4 is a block diagram illustrating I/O blocks grouped into I/O banks in accordance with a preferred embodiment of the present invention.

Referring to FIG. 4, a block diagram of the PLD 102 illustrating I/O blocks grouped into I/O banks is shown. The I/O blocks 100a–100n may be combined to form I/O banks 168a–168n. The I/O cells of an I/O block may be split between two I/O banks. For example, the I/O cells of I/O block 100f may be split between I/O banks 168c and 168d. The I/O cells within an I/O bank may be configured for different I/O standards. In one example, the I/O banks 168a–168n may be configured to support all of the current I/O standards within the 1.5V to 3.3V range.

Each I/O bank 168a–168n may have an independent supply voltage (e.g., VCCIO_0–VCCIO_N) and a reference voltage (e.g., VREF_0–VREF_N). The supply voltages VCCIO_0–vVCCIO_N and the reference voltages VREF_0–VREF_N may be the same or different voltage levels, respectively. For example, VCCIO1 may have a voltage level of 3.3 volts while VCCIO2 may have a voltage level of 2.5 volts.

Each of the I/O banks 168a–168n may have an input pin that may receive the voltage reference signals VREF_0–VREF_N. If an I/O bank is configured for an I/O standard that does not require a voltage reference signal, the voltage reference pin for that I/O bank may be used as a standard I/O pin.

The voltage requirements of a particular I/O standards may limit the combination of I/O standards in a single I/O bank. For example, I/O standards not requiring a reference voltage may be used in the same bank as any other I/O standard if the I/O standards use the same supply voltage VCCIO. For I/O standards requiring a reference voltage, the supply voltage VCCIO and the reference voltage VREF must be the same to be supported in the same I/O bank.

The I/O standards and the corresponding supply voltage VCCIO may be summarized as in the following TABLE 1:

TABLE 1

| VCCIO | I/O STANDARDS |
| --- | --- |
| 3.3 V | LVTTL, LVCMOS, PCI, SSTL3, GTL+ |
| 2.5 V | LVCMOS2, SSTL2, GTL+ |
| 1.8 V | JEDEC 1.8 V |
| 1.5 V | HSTL Class I through IV |

The I/O standards and the corresponding voltage reference voltage may be summarized as in the following TABLE 2:

TABLE 2

| VREF | I/O STANDARDS |
| --- | --- |
| None | JEDEC 1.8 V, LVCMOS, LVCMOS2, LVTTL, PCI |
| 0.75 V | HSTL Class I, HSTL Class II |
| 0.9 V | HSTL Class III, HSTL Class IV |
| 1 V | GTL+ |
| 1.25 V | SSTL2 Class I, SSTL2 Class II |
| 1.5 V | SSTL3 Class I, SSTL3 Class II |

The I/O blocks 100a–100n may be configured to provide support for each of the I/O standards listed in TABLE 1 and TABLE 2.

The present invention may provide a flexible programmable logic device that supports multiple I/O voltages, and I/O standards in a single integrated circuit.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    an input/output circuit configured to (i) connect to an end of a bus and (ii) operate in one or more modes in response to one or more first control signals, said input/output circuit comprising one or more input/output cells comprising a first register configured to generate an output enable signal; and
    a programmable logic device configured to generate said one or more first control signals.

2. The apparatus according to claim 1, wherein said apparatus comprises an input/output block in said programmable logic device.

3. The apparatus according to claim 1, wherein said one or more input/output cells are further configured to select a source and polarity of a clock signal presented to said first register in response to said one or more first control signals.

4. The apparatus according to claim 1, wherein said input/output cells comprise a second register.

5. The apparatus according to claim 4, wherein said second register is configured by said one or more first control signals to latch an input signal or an output signal.

6. The apparatus according to claim 1, wherein said first register is configured to generate said output enable signal in response to one of (i) a plurality of second control signals, (ii) a power supply voltage and (iii) a power supply ground potential selected in response to said one or more first control signals.

7. The apparatus according to claim 1, wherein said input/output cells further comprise a slew rate control circuit configured to select a predetermined slew rate in response to said one or more control signals.

8. The apparatus according to claim 1, wherein said input/output cells further comprise a bus hold circuit configured to generate a predetermined output signal in response to said one or more control signals.

9. The apparatus according to claim 1, wherein said bus comprises a routing channel of said programmable logic device.

10. The apparatus according to claim 1, further comprising a plurality of buses, said busses having a first end and second end, wherein each end of said plurality of busses is connected to one of said input/output circuits.

11. The apparatus according to claim 1, wherein a plurality of said input/output circuits are combined to form an input/output bank.

12. The apparatus according to claim 11, wherein said input/output banks are configured to support one or more I/O standards simultaneously.

13. The apparatus according to claim 1, wherein said input/output circuit connects a number of I/O pins to said bus.

14. The apparatus according to claim 1, wherein said programmable logic device comprises:
- a first routing channel run parallel to a first axis, said first routing channel having a first end and a second end;
- a second routing channel run parallel to a second axis, said second routing channel having a first end and a second end; and
- a plurality of said input/output circuits, wherein each end of said first and said second routing channels is connected to one of said plurality of input/output circuits.

15. An apparatus comprising:
- means for communicating input/output signals configured to (i) connect to an end of a bus and (ii) operate in one or more modes in response to one or more control signals, said input/output means comprising a register configured to generate an output enable signal; and
- means for programmably generating said one or more control signals.

16. A method of laying out a programmable logic device comprising the steps of:
- (A) placing a routing channel parallel to an axis of said programmable logic device, said routing channel having a first and a second end; and
- (B) connecting a first input/output circuit, configured to operate in one or more modes in response to one or more control signals generated by said programmable logic device, to said first end of said routing channel, wherein said first input/output circuit comprises one or more input/output cells comprising a register configured to generate an output enable signal.

17. The method according to claim 16, further comprising the step of:
- (C) connecting a second input/output circuit, configured to operate in one or more modes in response to one or more control signals generated by said programmable logic device, to said second end of said routing channel.

18. The apparatus according to claim 1, wherein said one or more input/output cells further comprise:
- an output buffer having an enable input coupled to an input and an output of said first register, wherein one of said input and said output is selected in response to said one or more first control signals to control said output buffer.

19. The method according to claim 16, further comprising:
- coupling an enable input of an output buffer to an input and an output of said register, wherein one of said input and said output is selected in response to said one or more control signals to control said output buffer.

20. The method according to claim 16, wherein said first register is configured to generate said output enable signal in response to one of (i) a plurality of second control signals, (ii) a power supply voltage and (iii) a power supply ground potential selected in response to said one or more first control signals.

* * * * *